United States Patent
Olivera Brizzio

(10) Patent No.: US 8,658,909 B2
(45) Date of Patent: Feb. 25, 2014

(54) PROGRAMMABLE BREADBOARD MATRIX INTERCONNECTION BOX

(76) Inventor: Pablo Oscar Olivera Brizzio, Barrio Jardin Pinar del Este (UY)

(*) Notice: Subject to any disclaimer, the term of this patent is extended or adjusted under 35 U.S.C. 154(b) by 175 days.

(21) Appl. No.: 13/405,299

(22) Filed: Feb. 25, 2012

(65) Prior Publication Data

US 2013/0223029 A1 Aug. 29, 2013

(51) Int. Cl.
*H05K 1/11* (2006.01)
(52) U.S. Cl.
USPC .................................................. 174/261
(58) Field of Classification Search
None
See application file for complete search history.

(56) References Cited

U.S. PATENT DOCUMENTS

| | | | |
|---|---|---|---|
| 3,622,924 A | 11/1971 | Harcourt | |
| 3,631,522 A | 12/1971 | Breeze | |
| 4,779,340 A | 10/1988 | Kihm | |
| 5,481,436 A * | 1/1996 | Werther | 361/784 |
| 5,712,608 A | 1/1998 | Shimomura et al. | |
| 6,650,548 B1 * | 11/2003 | Swetland | 361/780 |
| 6,916,211 B2 * | 7/2005 | Price | 439/697 |
| 7,611,357 B2 * | 11/2009 | Han et al. | 439/39 |
| 7,758,349 B2 | 7/2010 | Han et al. | |
| 2003/0043554 A1 * | 3/2003 | Seymour | 361/760 |
| 2005/0255719 A1 | 11/2005 | Heidlein | |
| 2007/0111573 A1 * | 5/2007 | Seymour | 439/180 |
| 2008/0233768 A1 * | 9/2008 | Joshi et al. | 439/49 |
| 2009/0011539 A1 * | 1/2009 | Jeng et al. | 438/107 |
| 2009/0298023 A1 * | 12/2009 | Kim et al. | 434/224 |
| 2010/0048038 A1 * | 2/2010 | Han et al. | 439/39 |
| 2011/0028007 A1 * | 2/2011 | Schlossmacher et al. | 439/43 |

\* cited by examiner

*Primary Examiner* — Jinhee Lee
*Assistant Examiner* — Xanthia C Cunningham
(74) *Attorney, Agent, or Firm* — QuickPatents; Kevin Prince

(57) ABSTRACT

The present device is a programmable breadboard matrix interconnection box capable of receiving data from a computer or controller and automatically establishing connections between contact points. A conductor layer, a magnetic layer, and a contact layer are used to automate the connections between contact points. The conductor layer provides conductors which move between 'ON' and 'OFF' positions and rows/columns which can receive electric current. The magnetic layer provides a necessary magnetic field. The contact layer connects the conductor to the designated contact point. A controller activates each conductor using the Laplace Force generated by the magnetic field and electric current.

20 Claims, 7 Drawing Sheets

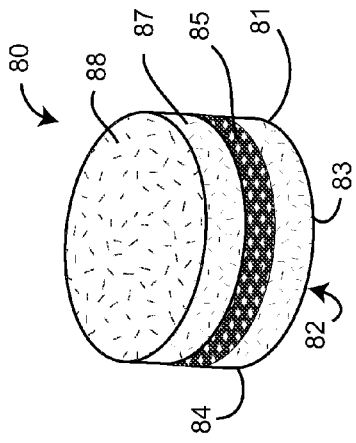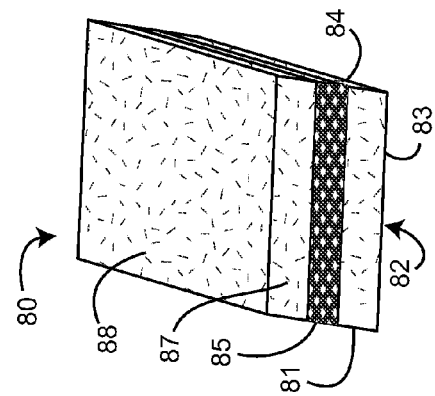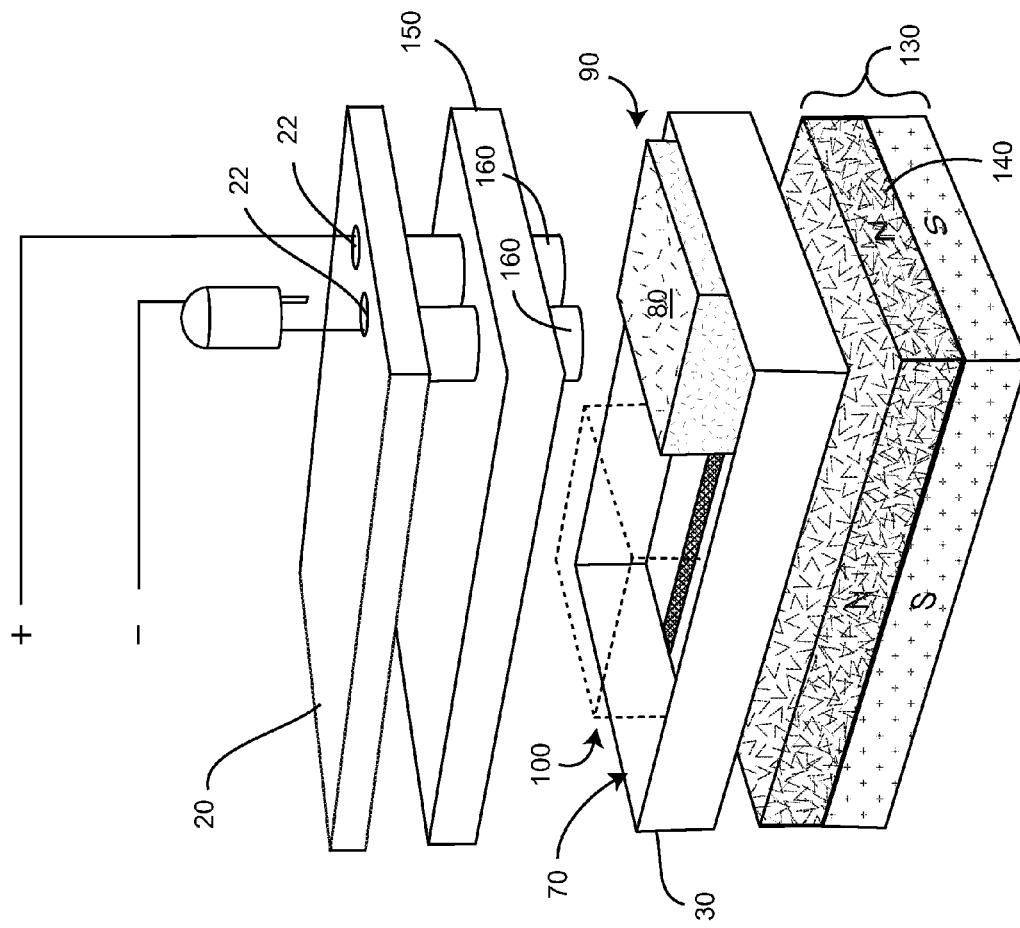

PROGRAMMABLE BREADBOARD MATRIX INTERCONNECTION BOX

CROSS-REFERENCE TO RELATED APPLICATIONS

Not Applicable.

STATEMENT REGARDING FEDERALLY SPONSORED RESEARCH AND DEVELOPMENT

Not Applicable.

FIELD OF THE INVENTION

This invention relates to electrical breadboards, and more particularly to a programmable electrical breadboard.

DISCUSSION OF RELATED ART

In electronic circuit design, a circuit typically needs to be tested physically before production can begin. A breadboard is a device for designing and testing electronic circuits during the prototyping stage. Typically, a breadboard will have a plurality of contact points with spring clips to retain wires and electronic components. The user will insert various electronic components, such as LEDs, resistors, capacitors, and ROM modules into the individual contact points and will connect these contacts with other contact points using copper wire. Terminal and bus strips are used to efficiently wire the devices and provide power to the circuit. Because no soldering is required, breadboards are reusable and offer a quick and efficient mechanism to test simple and complicated electronics alike, from basic digital clocks to advanced processors.

Lorentz Force is the electromagnetic force exhibited when electric and magnetic fields are combined. Laplace Force is a type of Lorentz Force where a wire carrying an electric current reacts with a magnetic field and creates a force whose magnitude is related to the length of the wire and whose direction is along the wire and aligned with the direction of the current. A magnetic field sufficient to create a Laplace Force can be generated from permanent magnets or electromagnets.

U.S. Pat. No. 4,779,340 to Kihm et al. on Oct. 25, 1988, describes a carrier board having an array of contacts and an array of switches which are used to create electronic circuits. A plurality of conductor connectors overlap and are connected when a signal is sent to a deformable material to enable or disable a connection. While the device does incorporate a wireless breadboard, its mechanism for connecting the contact points is complicated, unreliable, and prone to failure due to the usage of pressure, heat, or other physical means to establish the connection.

U.S. Pat. No. 7,758,349 to Han et al. on Jul. 20, 2010, describes a breadboard device having contact pads and magnetic component connectors where connections between the contact pads and magnetic component connectors are made by magnetic force. While the device does incorporate magnetic force, it utilizes the attraction force of magnetism as opposed to the generally repulsive, or Laplace Force. Furthermore, it is not programmable by computer, still requires manual connection, and the circuit cannot be replicated easily.

U.S. Pat. No. 5,712,608 to Shimomura et al. on Jan. 27, 1998, describes a breadboard device having a plurality of latching relays arranged in a matrix and mounted on a base of an electrically insulative material. Each of the relays has a magnetically coupled excitation coil to open and close the relays. While the device does incorporate magnetic force, it utilizes the magnetic field generated by a current as opposed to the Laplace Force of a wire having current in an already-present magnetic field. Furthermore, the reference does not suggest that the breadboard device is programmable by a computer, or that it can be replicated on another device easily.

While several breadboards exist which attempt to improve upon the traditional model, they often involve manual wiring, they can be time consuming, they can be unreliable, the circuits may not be replicated quickly, and they cannot complement modern schematic programs in use today for creating electronic circuits.

Therefore, there is a need for a device that can replicate traditional breadboard wire connections, but can be programmed by a computer or controller, can be created quickly, can be replicated quickly, will eliminate human error present in manual wiring, and can handle more complex designs. The present invention accomplishes these objectives.

SUMMARY OF THE INVENTION

The present device is a programmable breadboard matrix interconnection box capable of receiving data from a computer or controller and automatically establishing connections between contact points. The user simply inserts electronic components into the device and programs the connections, creating a the electronic circuit for physical testing. The unique method of establishing connections ensures durability and efficiency within the device.

The present invention comprises generally three layers: a conductor layer, a magnetic layer, and a contact layer. The conductor layer is responsible for providing a plurality of slidable conductors that each can switch between an 'ON' position and an 'OFF' position, and for passing current through rows and columns of such conductors. The magnetic layer is responsible for providing the magnetic field for reacting with the rows and columns of the conductor layer, creating the Laplace Force to move the slidable conductor between positions. The contact layer is responsible for connecting the slidable conductor to the designated contact point. A controller is electrically connected to the magnetic layer in order to generate the desired Laplace Forces at intersecting row and column positions, in sequence. Together, the layers and controller create the functionality of a programmable breadboard without the drawbacks of manually wiring each circuit design.

As mentioned above, each contact point will have two positions, an 'OFF' position and an 'ON' position. When in the 'OFF' position, no connection is made between contact points. To move the conductor to the 'ON' position from the 'OFF' position, for example, current is passed through the conductor's corresponding row and column in the conductor layer to establish a current through the conductor, Laplace Force is generated which moves the slidable conductor to the 'ON' position in accordance with the magnetic field of the magnet layer, thereby establishing a connection between contact points. This mechanism replaces the tedious and repetitious task of wiring electrical connections manually between many points on the breadboard. Furthermore, because only the core electronic components are required, the breadboard will be much cleaner and easier to analyze and debug.

Other features and advantages of the present invention will become apparent from the following more detailed description, taken in conjunction with the accompanying drawings, which illustrate, by way of example, the principles of the invention.

DESCRIPTION OF THE DRAWINGS

FIG. 2 is a partial, exploded view of the programmable breadboard matrix interconnection box;

FIG. 3A is a perspective view of a circular sliding conductor with an insulation layer;

FIG. 3B is a perspective view of a rectangular sliding conductor with an insulation layer;

DETAILED DESCRIPTION OF THE PREFERRED EMBODIMENT

Figure 1:
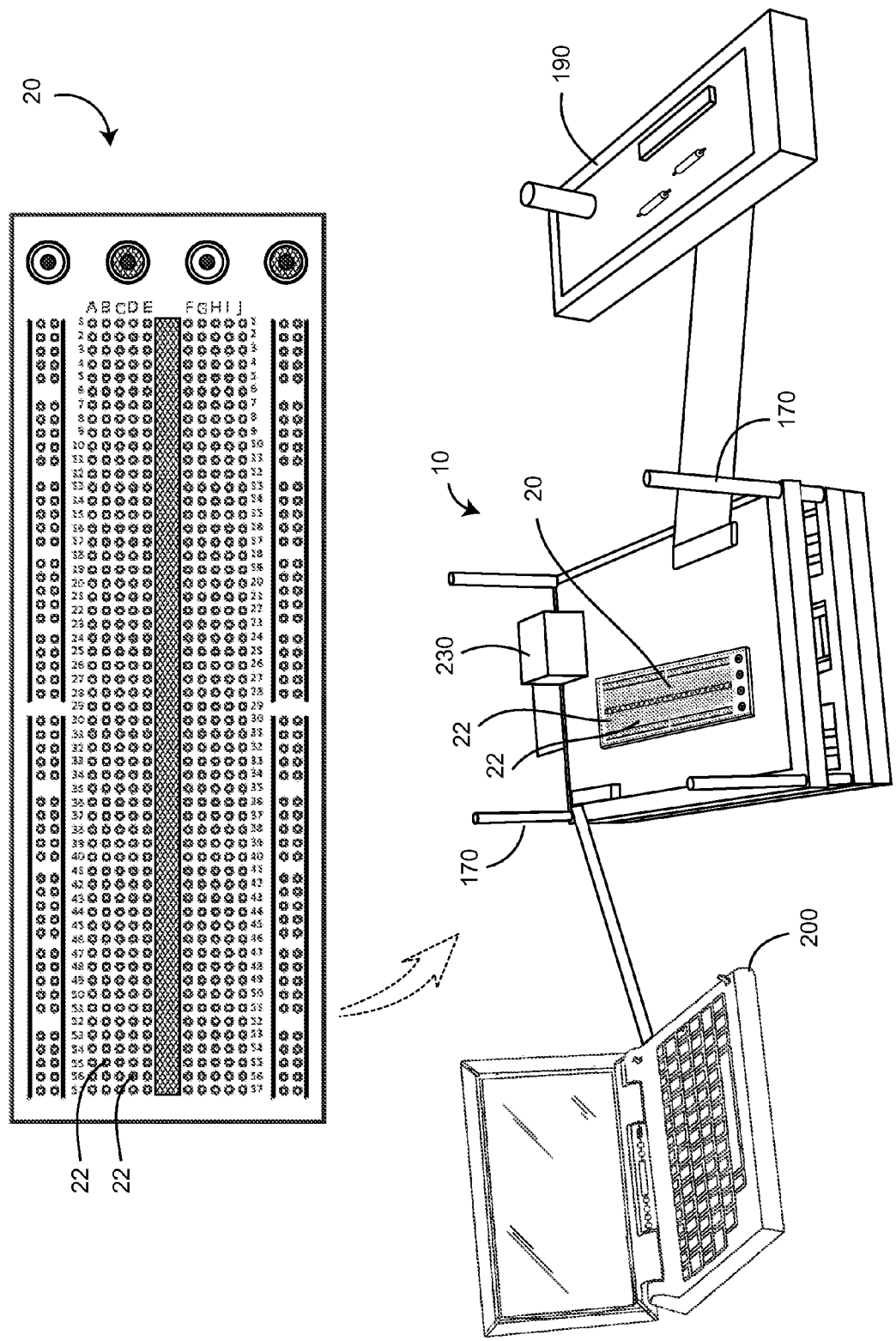
FIG. 1 is a perspective view of the programmable breadboard matrix interconnection box in a typical setup.
Figure 5A:
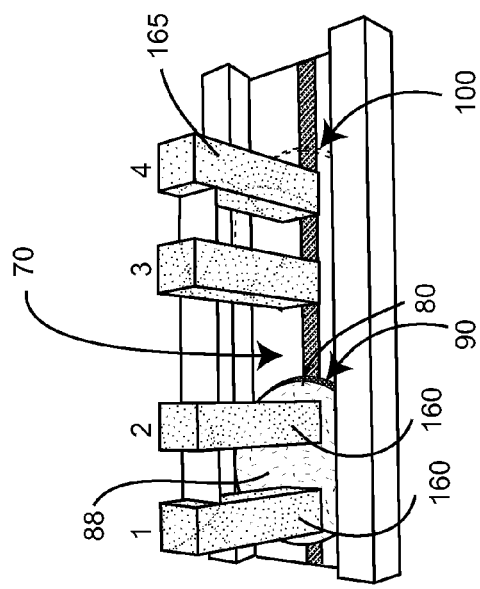
FIG. 5A is a perspective view of the sliding conductor layer with contact points.
Figure 5B:
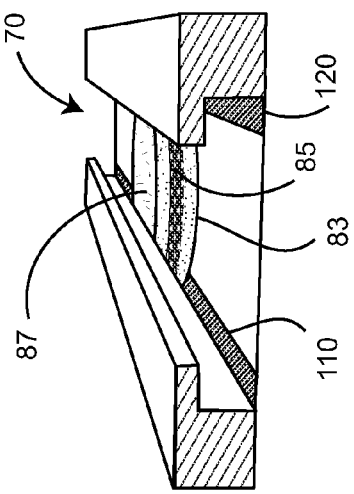
FIG. 5B is a perspective view of the sliding conductor layer, the contact points omitted for clarity of illustration.
Figure 4:
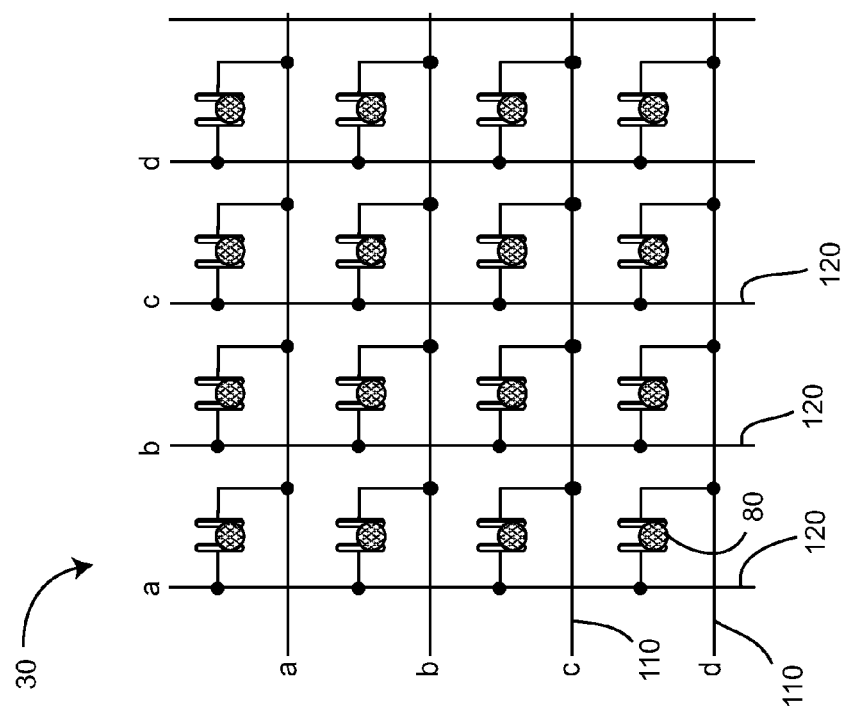
FIG. 4 illustrates a wiring topology for rows and columns of conductors.
Figure 7:
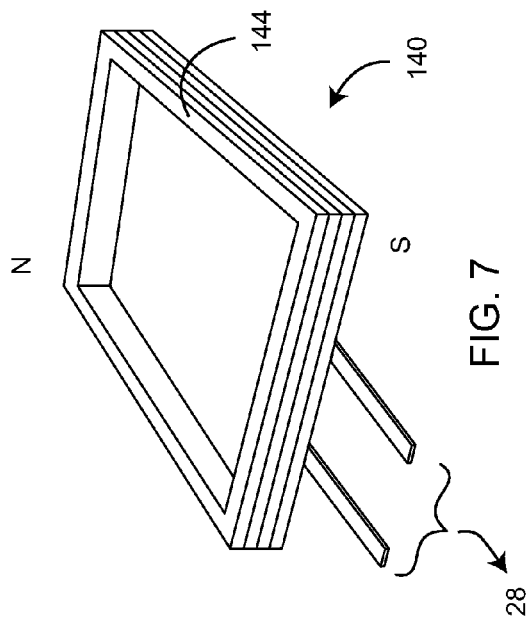
FIG. 7 is a perspective view of an electromagnetic magnet in the magnetic field layer.
Figure 8:
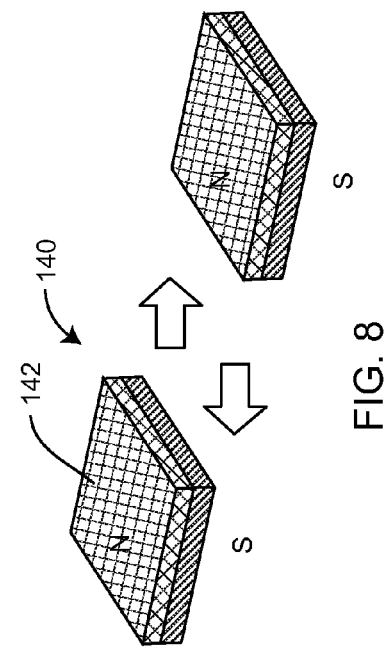
FIG. 8 is a perspective view of a permanent magnet in the magnetic field layer.

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

The present invention discloses an interconnection board 10 for connecting electrically-unique contact points 22 on a breadboard 20 without wiring contact points 22 individually. This is accomplished by utilizing a conductor layer 30, a magnetic layer 130, and a contact layer 150 together to connect the individual contact points 22. A controller 190 is used in conjunction with the layers 30, 130, 150 to create a programmable circuit, and an upper layer 87 is used for connecting electronic components to the breadboard 20.

Figure 6:
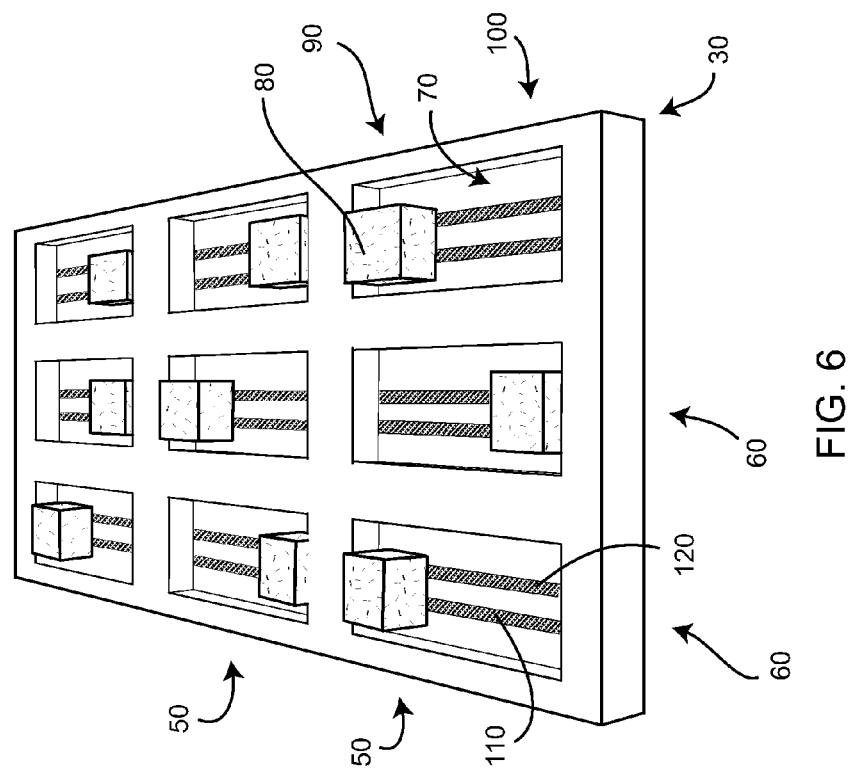
FIG. 6 is a perspective view of the sliding conductor layer, the contact points omitted for clarity of illustration.

The conductor layer 30 comprises a plurality of cells 70 arranged in a grid of rows 50 and columns 60. Each cell 70 comprises a confined space (See 70, FIG. 6) in which an electrical slidable conductor 80 may slide between an 'ON' 90 and an 'OFF' 100 position. Each conductor 80 has a conductive lower layer 83 with a bottom side 82, an electrically-insulated middle layer 85, and a conductive upper layer 87. As such, the upper layer 87 is electrically isolated from the lower layer 83. The insulation layer 85 is critical in order to prevent short-circuits. The slidable conductors 80 may be cylindrical (FIG. 3A) or rectangular (FIG. 3B), although any suitable shape can be used.

The conductor layer 80 further comprises a plurality of row conductors 110, each adapted to contact the bottom side 82 of each slidable conductor 80 in one row 50 proximate to one edge 81 of each conductor 80, and a plurality of column conductors 120, each adapted to contact the bottom side 82 of each slidable conductor 80 in one column 60 proximate to an opposing edge 84 of each conductor 80. Current may flow between each row conductor 110 and each column conductor 120 through only one of the slidable conductors 80 in the grid regardless of the position of each slidable conductor 80.

Figure 9:
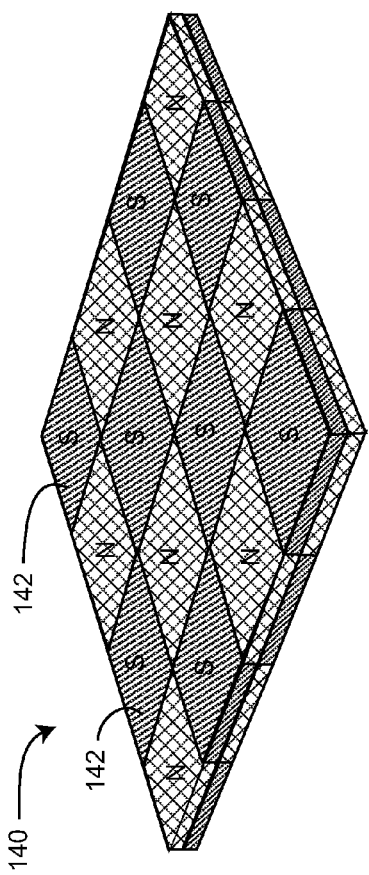
FIG. 9 is a perspective view of a matrix of permanent magnets in the magnetic field layer, alternating in a predetermined way to facilitate assembly thereof.
Figure 10:
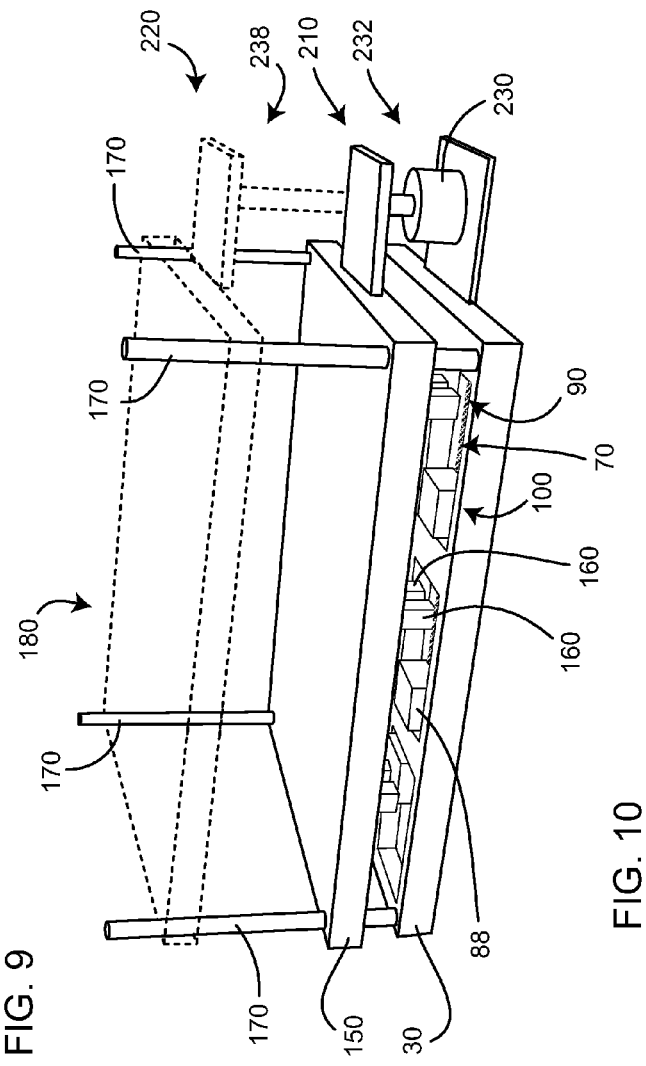
FIG. 10 is a perspective view of the electrical connection layer and the conductor layer.
Figure 11:
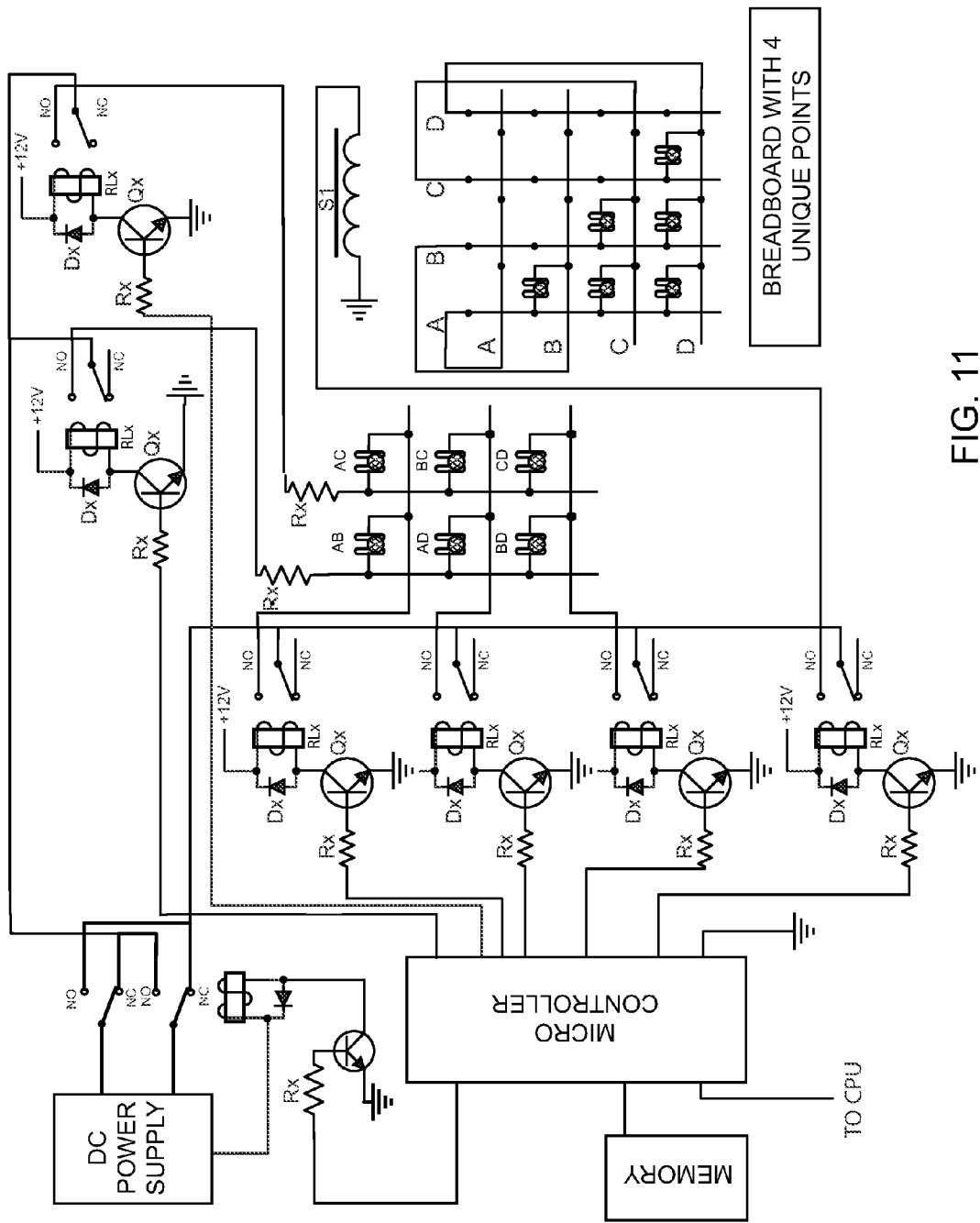
FIG. 11 is a schematic diagram of the programmable breadboard matrix interconnection box.

The magnetic layer 130 is situated below the conductor layer 30 and comprises a plurality of magnets 140 vertically aligned with each cell 70 of the conductor layer 30. In the preferred embodiment, the plurality of magnets 140 are electro-magnets 144, each connected to a power source 28 and capable of producing a magnetic field. In an alternative embodiment, the plurality of magnets 140 are permanent magnets 142 oriented opposite in polarity to those laterally adjacent thereto, but not diagonally adjacent thereto (See FIG. 9), so as to facilitate the assembly of the magnetic layer 130. In a further alternative embodiment, a single electro-magnet 144 with a large coil can be used to generate the electric field. In yet a further alternative embodiment, a single permanent magnet 142 can be used to generate the magnetic field. If several magnets 142, 144 are used, the polarity of the magnetic field is equivalent to changing the polarity of the voltage source 28. As such, if a magnet 142, 144 is oriented opposite in polarity to those laterally adjacent to it, the polarity of the voltage source 28 will also be opposite to those laterally adjacent to it.

The contact layer 150 is situated above the conductor layer 30 and comprises a pair of contacts 160 aligned with each 'ON' position 90 of each cell of the conductor layer 30. The contacts 160 of each cell 70 are electrically connected through the top layer 87 of the slidable conductor 80 only if the slidable conductor 80 is in its 'ON' position 90. Each contact 160 is electrically connected with one of the electrically-unique contact points 22 of the device 10.

The conductor 30, magnetic 130, and contact layers 150 must be aligned in order to function properly. At least one vertical post 170 is cooperative with the conductor layer 30, magnetic layer 130, and contact layer 150 such that each layer is vertically mutually fixed in a stack 180. At least one vertical post 170 keeps each layer 30, 130, 150 in vertical mutual alignment, ensuring that the slidable conductor 80 is moved by the appropriate cell 70. In an alternative embodiment, the contact layer 30 is constrained for slidable movement between its lowered 210 and raised positions 220 only.

Any two points 22 on the breadboard 20 may be electrically connected by connecting each point 22 to the opposing contacts 160 of one cell 70. A current is then applied to the row conductor 110 and column conductor 120 associated with the cell 70, moving the slidable conductor 80 to its 'ON' position 90 through Laplace force in accordance with the magnetic field of the plurality of magnets 140 and the polarity of the current. The current must be sufficient enough to produce a Laplace force capable of overcoming the friction of moving within the cell 70 and of any contacts 160 contacting the conductor 80 such that the contacts 160 of the one cell 70 are electrically connected via the conductor 80.

A controller 190 is electrically connected to each row 110 and column conductor 120 for activating and deactivating cells 70. The controller 190 is adapted to change any of the positions of the conductors 80 by applying a current of the appropriate polarity to each unique pair of row 110 and column conductors 120 in turn to move each associated conductor 80 to either its 'ON' 90 or 'OFF' position 100. The controller 190 includes a programming interface 200 adapted for interfacing to a computer 200, whereby the computer 200 may be used to establish any pattern of 'ON/OFF' 90, 100 positions for each conductor 80 and then activate the controller 190 to program the interconnection board 10.

In an alternative embodiment, the contact layer 150 is situated above the conductor layer 30 and comprises a pair of contacts 160 vertically aligned with each 'ON' position 90 of each cell 70 of the conductor layer 30. When the conductor layer 30 is in contact with the contact layer 150, each pair of contacts 160 of each cell 70 is electrically connected through the top layer 87 of the slidable conductor 80 if the slidable conductor 80 is in its 'ON' position 90. Furthermore, each contact 160 is electrically connected with one of the electrically-unique points 22 of the breadboard 20. The contact layer 150 is selectively positionable between a lowered position 210 in contact with the conductor layer 30 and a raised position 220 away from the conductor layer 30.

In this embodiment, any two points 22 on the breadboard 20 may be electrically connected by connecting each point 22 to one of the contacts 160 of one cell 70, placing the contact layer 150 in the raised position 220, and then applying a current to the row conductor 110 and column conductor 120 associated with the cell 70. Laplace force will move the slidable conductor 80 to its 'ON' position 90 in accordance with the magnetic field of the magnet 140 and the polarity of the current applied thereby. The contact layer 150 is then lowered to the lowered position 210 such that the contacts 160 of the cell 70 are electrically connected via the conductor layer 30.

Furthermore, the contact layer 30 is mechanically coupled with at least one solenoid 230 such that the solenoid 230 may move between an extended position 238 wherein the contact layer 150 is in its raised position 220 and a retracted position 232 wherein the contact layer 150 is in its lowered position 210. The controller 190 is electrically connected to each row 110 and column conductor 120 for activating and deactivating each cell 70 in turn and is further connected to the solenoid 230. The controller 190 is adapted to change the positions of the conductors 80 by activating the solenoid 230 to raise the contact layer 150 above the conductor layer 30 and then applying a current of the appropriate polarity to each unique pair of row 110 and column conductors 120 in turn to move each associated conductor 80 to either its 'ON' 90 or 'OFF' position 100. The controller 190 then deactivates the solenoid 230 to lower the contact layer 150 onto the conductor layer 30.

The contact layer 150 of this embodiment may further comprise a pair of disconnected contacts 165 vertically aligned with each 'OFF' position 100 of each cell 70 of the conductor layer 30. When the conductor layer 30 is in contact with the contact layer 150, each pair of disconnected contacts 165 of each cell 70 facilitates the holding of the conductor 80 in place by friction if the conductor 80 is in the 'OFF' position 100.

Figure 12:
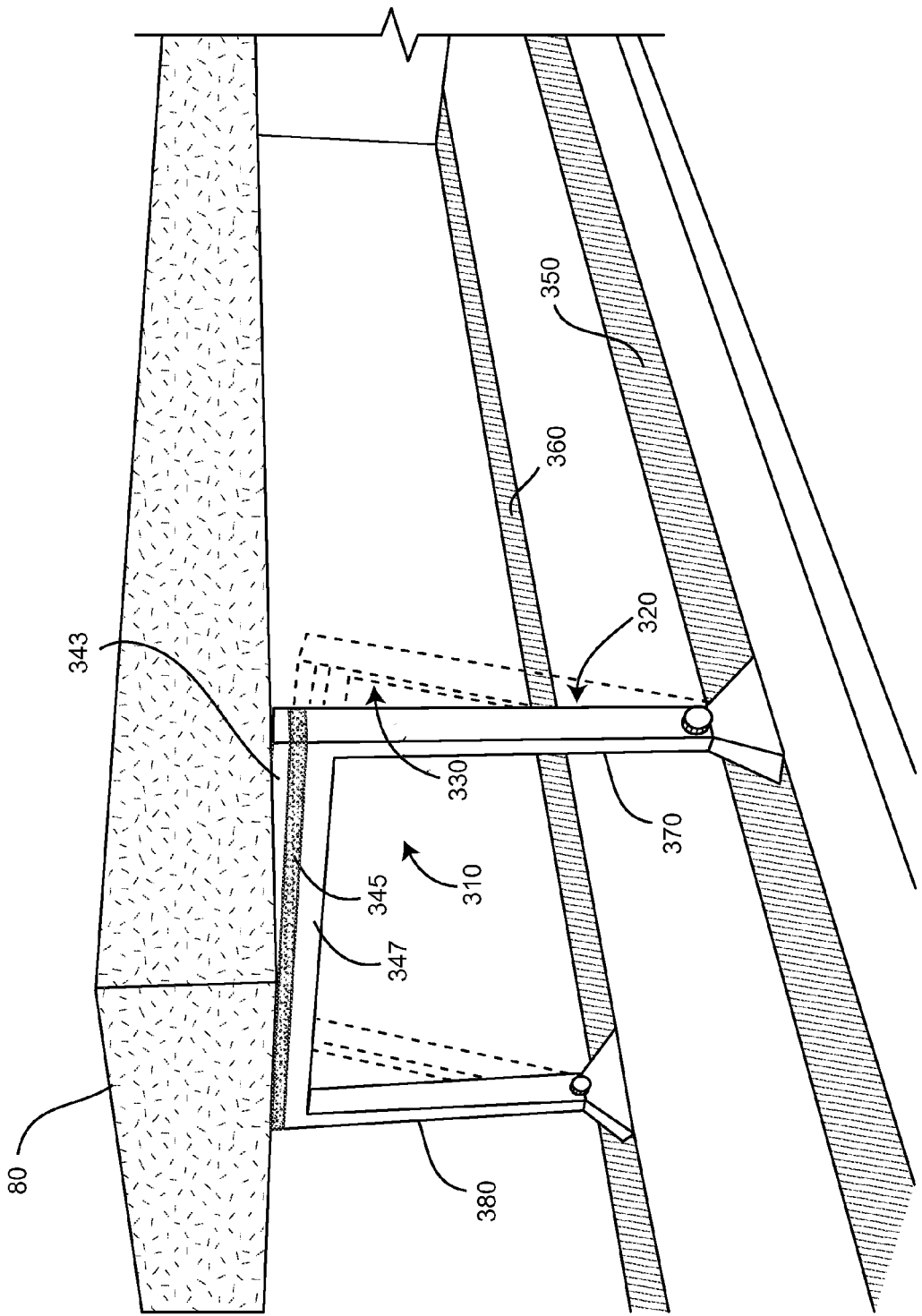
FIG. 12 is a partial perspective view of an alternate embodiment of the conductor layer.

In a further alternative embodiment, each cell 70 includes a confined space in which an electrical pivotal conductor 310 (FIG. 12) may pivot between an 'ON' position 320 and an 'OFF' position 330. Each pivotal conductor 310 has a top conductor 343, a middle insulator layer 345, and a bottom conductor 347 electronically isolated from the top conductor 343. The bottom conductor 347 further includes a plurality of row conductors 350, each adapted to contact the bottom conductor 347 of each pivotal conductor 310 on the row pivot leg 370, and a plurality of column conductors 360, each adapted to contact the bottom conductor 347 of each pivotal conductor 310 on the column pivot leg 380.

Current may flow between each row conductor 350 and each column conductor 360 through only one of the pivotal conductors 310 in the grid regardless of the position of each pivotal conductor 310. The pivotal conductor 310 is perpendicular 390 to the row conductor 350 and column conductor 360 associated with the cell 70 when in the 'ON' position 320, and has an acute angle between the row conductor 350 and column conductor 360 associated with the cell 70 and the bottom conductor 347 when in the 'OFF' position 330.

The conductors 80, 310 and other conductive materials 22, 50, 60, 82, 87, 110, 120, 160, 165, 343, 347, 350, 360, 370, 380 can be made from copper, aluminum, silver, graphite, or any other suitable conductive material. The insulation layers 85, 345 of the conductors 80, 310 can be made of rubber, plastic, insulator paint, or any other suitable insulator. All other materials not intended to carry a current can be made of plastic, silicone, or any other suitable non-conductive material.

While a particular form of the invention has been illustrated and described, it will be apparent that various modifications can be made without departing from the spirit and scope of the invention. For example, the conductors 80, 310 can be circular or rectangular. Furthermore, the conductors 80, 310 can be rotatable or otherwise movable so long as they can establish an "ON" 90, 320 and "OFF" 100, 330 position using Laplace Force. Accordingly, it is not intended that the invention be limited, except as by the appended claims.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

While certain aspects of the invention are presented below in certain claim forms, the inventor contemplates the various aspects of the invention in any number of claim forms. Accordingly, the inventor reserves the right to add additional claims after filing the application to pursue such additional claim forms for other aspects of the invention.

What is claimed is:

1. An interconnection board for connecting electrically-unique points on a breadboard, comprising:
   a conductor layer having a plurality of cells arranged in a grid of rows and columns, each cell including a confined space in which an electrical slidable conductor may slide between an on and an off position, each conductor having a conductive lower layer with a bottom side, an electrically-insulated middle layer, and a conductive upper layer with a top side and electrically isolated from the lower layer, the conductor layer further including a plurality of row conductors each adapted to contact the bottom side of each slidable conductor in one row proximate one edge of each conductor, and a plurality of column conductors each adapted to contact the bottom side of each slidable conductor in one column proximate an opposing edge of each conductor, such that a current may flow between each row conductor and each column conductor through only one of the slidable conductor in the grid regardless of the position of each slidable conductor;
   a magnetic layer situated below the conductor layer and having a plurality of magnets vertically aligned with each cell of the conductor layer;
   a contact layer situated above the conductor layer and having a pair of contacts aligned with each on position of each cell of the conductor layer, such that the contacts of each cell are electrically connected through the top layer of the slidable conductor only if the slidable conductor is in its on position, each contact electrically connected with one of the electrically-unique points of the breadboard;
   whereby any two points on the breadboard may be electrically connected by connecting each point to opposing contacts of one cell, applying a current to the row conductor and column conductor associated with the cell to move the slidable conductor to its on position by Laplace force in accordance with the magnetic field of the plurality of magnets and the polarity of the current, the current sufficient to produce a Laplace force able to overcome the friction of the contacts contacting the conductor, such that the contacts of the one cell are electrically connected via the conductor.

2. The interconnection board of claim 1 wherein each of the plurality of magnets in the magnetic layer is a permanent magnet oriented opposite in polarity to those laterally adjacent thereto, but not diagonally adjacent thereto.

3. The interconnection board of claim 1 wherein the magnets are each electro-magnets, each connected to a power source to produce a magnetic field.

4. The interconnection board of claim 1 further including at least one vertical post cooperative with the conductor layer, magnetic layer, and contact layer, such that each layer is vertically mutually fixed in a stack, each layer kept in vertical mutual alignment by the at least one vertical post.

5. The interconnection board of claim 1 further including a controller electrically connected to each row and column conductor, the controller adapted to change any of the positions of the conductors by applying a current of the appropriate polarity to each unique pair of row and column conductors in turn to move each associated conductor to either its on or off position in turn.

6. The interconnection board of claim 5 wherein the controller includes a programming interface adapted for interfacing to a computer, whereby the computer may be used to establish any pattern of on/off positions for each conductor and then activate the controller to program the interconnection board.

7. An interconnection board for connecting electrically-unique points on a breadboard, comprising:
   a conductor layer have a plurality of cells arranged in a grid of rows and columns, each cell including a confined space in which an electrical slidable conductor may slide between an on and an off position, each conductor having a conductive lower layer with a bottom side, an electrically-insulated middle layer, and a conductive upper layer with a top side and electrically isolated from the lower layer, the conductor layer further including a plurality of row conductors each adapted to contact the bottom side of each slidable conductor in one row proximate one edge of each conductor, and a plurality of column conductors each adapted to contact the bottom side of each slidable conductor in one column proximate an opposing edge of each conductor, such that a current may flow between each row conductor and each column conductor through only one of the slidable conductor in the grid regardless of the position of each slidable conductor;
   a magnetic layer situated below the conductor layer and having a magnet vertically aligned with each cell of the conductor layer;
   a contact layer situated above the conductor layer and having a pair of contacts vertically aligned with each on position of each cell of the conductor layer, such that when the conductor layer is in contact with the contact layer each pair of contacts of each cell is electrically connected through the top layer of the slidable conductor if the slidable conductor is in its on position, each contact electrically connected with one of the electrically-unique points of the breadboard;
   the contact layer selectively positionable between a lowered position in contact with the conductor layer and a raised position away from the conductor layer;
   whereby any two points on the breadboard may be electrically connected by connecting each point to one of the contacts of one cell, placing the contact layer in the raised position, applying a current to the row conductor and column conductor associated with the cell to move the slidable conductor to its on position by Laplace force in accordance with the magnetic field of the magnet and the polarity of the current, and lowering the contact layer to the lowered position such that the contacts of the one cell are electrically connected via the conductor.

8. The interconnection board of claim 7 wherein each of the plurality of magnets in the magnetic layer is a permanent magnet oriented opposite in polarity to those laterally adjacent thereto, but not diagonally adjacent thereto.

9. The interconnection board of claim 7 wherein the magnets are each electro-magnets, each connected to a power source to produce a magnetic field.

10. The interconnection board of claim 7 further including at least one vertical post cooperative with the conductor layer, magnetic layer, and contact layer, such that the conductor layer and magnetic layer are vertically mutually fixed in a stack, and such that the contact layer is constrained for slidable movement between its lowered and raised positions only, each layer kept in vertical mutual alignment by the at least one vertical post.

11. The interconnection board of claim 7 wherein the contact layer is mechanically coupled with at least one solenoid, such that the at least one solenoid may move between an extended position wherein the contact layer is in its raised position, and a retracted position wherein the contact layer is in its lowered position.

12. The interconnection board of claim 11 further including a controller electrically connected to each row and column conductor, and the at least one solenoid, the controller adapted to change any of the positions of the conductors by activating the at least one solenoid to raise the contact layer above the conductor layer, and then applying a current of the appropriate polarity to each unique pair of row and column conductors in turn to move each associated conductor to either its on or off position in turn, and then deactivating the at least one solenoid to lower the contact layer onto the conductor layer.

13. The interconnection board of claim 12 wherein the controller includes a programming interface adapted for interfacing to a computer, whereby the computer may be used to establish any pattern of on/off positions for each conductor and then activate the controller to program the interconnection board.

14. The interconnection board of claim 1 wherein the contact layer further includes a pair of disconnected contacts vertically aligned with each off position of each cell of the conductor layer, such that when the conductor layer is in contact with the contact layer, each pair of disconnected contacts of each cell facilitates holding of the conductor in place by friction if the conductor is in the off position.

15. An interconnection board for connecting electrically-unique points on a breadboard, comprising:

a conductor layer having a plurality of cells arranged in a grid of rows and columns, each cell including a confined space in which an electrical pivotal conductor may pivot between an on and an off position, each conductor having a top conductor, a middle insulator layer, and a bottom conductor electronically isolated from the top conductor, the bottom conductor further including a plurality of row conductors each adapted to contact the bottom conductor of each pivotal conductor in one row proximate one edge of each conductor, and a plurality of column conductors each adapted to contact the bottom conductor of each pivotal conductor in one column proximate an opposing edge of each conductor, such that a current may flow between each row conductor and each column conductor through only one of the pivotal conductor in the grid regardless of the position of each pivotal conductor;

a magnetic layer situated below the conductor layer and having a plurality of magnets vertically aligned with each cell of the conductor layer;

a contact layer situated above the conductor layer and having a pair of contacts aligned with each on position of each cell of the conductor layer, such that the contacts of each cell are electrically connected through the top layer of the pivotal conductor only if the pivotal conductor is in its on position, each contact electrically connected with one of the electrically-unique points of the breadboard;

whereby any two points on the breadboard may be electrically connected by connecting each point to opposing contacts of one cell, applying a current to the row conductor and column conductor associated with the cell to move the pivotal conductor to its on position by Laplace force in accordance with the magnetic field of the plurality of magnets and the polarity of the current, the current sufficient to produce a Laplace force able to overcome the friction of the contacts contacting the conductor, such that the contacts of the one cell are electrically connected via the conductor.

16. The interconnection board of claim 15 wherein each of the plurality of magnets in the magnetic layer is a permanent magnet oriented opposite in polarity to those laterally adjacent thereto, but not diagonally adjacent thereto.

17. The interconnection board of claim 15 wherein the magnets are each electro-magnets, each connected to a power source to produce a magnetic field.

18. The interconnection board of claim 15 wherein the pivotal conductor further comprises a perpendicular orientation to the row conductor and column conductor associated with the cell when in the off position.

19. The interconnection board of claim 15 wherein the pivotal conductor further comprises an acute angle between the row conductor and column conductor associated with the cell and the bottom conductor when in the on position.

20. The interconnection board of claim 15 further including a controller electrically connected to each row and column conductor, the controller adapted to change any of the positions of the conductors by applying a current of the appropriate polarity to each unique pair of row and column conductors in turn to move each associated conductor to either its on or off position in turn, wherein the controller includes a programming interface adapted for interfacing to a computer, whereby the computer may be used to establish any pattern of on/off positions for each conductor and then activate the controller to program the interconnection board.

* * * * *